(12) United States Patent
Zhang et al.

(10) Patent No.: US 9,225,332 B1
(45) Date of Patent: Dec. 29, 2015

(54) ADJUSTABLE BUFFER CIRCUIT

(71) Applicant: Xilinx, Inc., San Jose, CA (US)

(72) Inventors: Wenfeng Zhang, San Jose, CA (US);
Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/681,898

(22) Filed: Apr. 8, 2015

(51) Int. Cl.
*H03K 19/094* (2006.01)
*H03K 19/0185* (2006.01)

(52) U.S. Cl.
CPC .. *H03K 19/018514* (2013.01); *H03K 19/09432* (2013.01)

(58) Field of Classification Search
CPC .................. H03K 19/09432; H03K 19/018514
USPC .................................................. 326/70, 115
See application file for complete search history.

(56) References Cited

U.S. PATENT DOCUMENTS

| | | | | |
|---|---|---|---|---|
| 5,909,127 | A * | 6/1999 | Pearson | H03K 19/0136 326/113 |
| 7,355,451 | B2 * | 4/2008 | Azadet | H03K 19/09432 326/26 |
| 2006/0061391 | A1 * | 3/2006 | Tam | H03K 19/09432 326/115 |
| 2007/0057702 | A1 * | 3/2007 | Suenaga | H03K 19/09432 327/108 |
| 2007/0188207 | A1 * | 8/2007 | Fiedler | H04L 25/028 327/170 |
| 2015/0002205 | A1 * | 1/2015 | Maeda | H03G 3/004 327/332 |

* cited by examiner

*Primary Examiner* — Don Le
(74) *Attorney, Agent, or Firm* — LeRoy D. Maunu (57) ABSTRACT

A common mode logic buffer device includes a current source configured to provide a source current. An input stage includes a first MOS transistor pair configured to generate, from the source current and based upon an input differential voltage, a differential current between two output paths. An output stage includes a second MOS transistor pair configured to generate an output differential voltage based upon an effective impedance provided for the each of the two output paths. An adjustment circuit is configured to adjust, in response to a control signal, the effective impedance of the second MOS transistor pair.

19 Claims, 7 Drawing Sheets

ADJUSTABLE BUFFER CIRCUIT

TECHNICAL FIELD

The disclosure generally relates to buffer circuits with adjustable frequency responses, and more particularly to common mode logic buffers with an adjustable output transfer function.

BACKGROUND

Buffer circuits, or amplifier circuits, provide electrical impedance transformation from one circuit to another. The buffer circuits can be configured with a desired input-output ratio (gain) and with a particular bandwidth. The gain can be unity or be less or more than unity. The gain can also be negative or positive. The bandwidth can be determined from a frequency range over which the gain of the buffer circuit is within a particular range. Unless otherwise stated, the bandwidth corresponds to a 3 decibel (db) range in the gain.

A particular type of buffer circuit is a common mode logic (CML) buffer that can be used in connection with high-speed signals that are used in wireless communication systems, serial data protocols, and other high-speed signaling solutions. A particular application for CML buffer circuits includes, but is not limited to, programmable logic devices (PLDs).

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

Implementations are directed toward a common mode logic buffer device that includes a differential input signal pair that includes a first input and a second input. A differential output signal pair that includes a first output and a second output. A current source provides a current and a reference voltage is present. A first metal-oxide-semiconductor (MOS) transistor pair includes a first MOS transistor with a gate connected to the first input and connected in series between the current source and the first output, and a second MOS transistor with a gate connected to the second input and connected in series between the current source and the second output. A second MOS transistor pair includes a third MOS transistor connected in series between the reference voltage and the first output, and a fourth MOS transistor connected in series between the reference voltage and the second output. A first adjustment circuit is configured to adjust, in response to a control signal, a first resistance value between the first output and a gate of the third MOS transistor. A second adjustment circuit configured to adjust, in response to the control signal, a second resistance value between the second output and a gate of the fourth MOS transistor.

Various implementations are directed toward a method for using a common mode logic (CML) buffer circuit. A differential input voltage is applied between gates of a first MOS transistor pair. Using the first MOS transistor pair, a differential current is generated between two output paths. The differential current is applied to an adjustment circuit that includes a second MOS transistor pair and that is configured to provide an output signal from the differential input voltage using a first transfer function with a pole at a first frequency. In response to a control signal received by the adjustment circuit, the pole is changed to a second frequency that is different from the first frequency.

In some implementations a common mode logic buffer device includes a current source configured to provide a source current. An input stage includes a first MOS transistor pair configured to generate, from the source current and based upon an input differential voltage, a differential current between two output paths. An output stage includes a second MOS transistor pair configured to generate an output differential voltage based upon an effective impedance provided for the each of the two output paths. An adjustment circuit is configured to adjust, in response to a control signal, the effective impedance of the second MOS transistor pair.

Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations described herein are directed toward a CML buffer circuit that is configured to adjust its input-output transfer function in response to a control signal. The adjustment of the input-output transfer function can be particularly useful for providing a large effective bandwidth by providing different transfer functions for different frequencies of operation. For example, the CML buffer circuit can be used as part of a PLD. The value of the control signal can be selected based upon the signaling frequency used by the design of a particular user of the PLD. Another value of the control signal can be selected based upon another signal frequency used by another design for the PLD. Moreover, within the same design, the value of the control signal can be adjusted during operation. For instance, the value can be selected to correspond to one or more different modes of communication, where the different modes have different frequencies of operation for the CML buffer circuit.

CML buffer circuits can be constructed with a pair of metal-oxide-semiconductor (MOS) field-effect transistors (FETs) that, together, are configured to receive a differential input signal. The pair of MOS transistors can produce a differential current that is based upon the differential input signal. For instance, the MOS transistors can split current between two output paths as a function of the input signal. The current can be supplied by a (constant) current source. A pair of impedance elements, each on a respective output path, can produce the differential output signal through the application of the differential current.

In some approaches, the pair of impedance elements can offer (primarily) resistive impedance. When such a technique is used, as the bandwidth increases, the current source provides an input-independent biasing for the CML buffer circuit and the maximum output swing is set by the resistive impedance (RL) multiplied by the current of the current source ($I_{tail}$), or $RL*I_{tail}$. Increasing the swing is accomplished by increasing either the resistive impedance, the current of the current source, or both. However, increasing the resistive value can reduce the bandwidth for capacitive loads. A high $I_{tail}$ can result in significant power consumption to achieve a large bandwidth. Moreover, the gain at low frequencies can be relatively large and can result in noise being accumulated, resulting in problems such as jitter performance.

In certain implementations, a passive inductor can be used to provide inductive peaking and thereby effectively increase the bandwidth relative to a set amount of current and resistance in the output paths. Inductive peaking (e.g., shunting) is provided when the voltage across the inductor responds to a change (e.g., increase) in current through the inductor. A passive inductor can be placed in series with the resistor such that when the current increases, the voltage provided at the output of the circuit is a function of the voltage from the current through the resistor and also the voltage of the passive inductor. A passive inductor can, however, occupy a large circuit area, as can the accompanying high-value resistor. Moreover, the gain at low frequencies can be relatively large, which can result in the aforementioned problems with noise (e.g., jitter performance).

Certain implementations described herein are directed toward a CML buffer circuit in which the input-output transfer function is adjusted by varying the effective impedance of output path(s) that are used to generate the output signal. For instance, each output path can include an active inductor that has a configurable effective impedance and that provides inductive peaking for the CML buffer circuit. As mentioned above, passive inductors can consume significant amounts of physical area, an area can be limited in some instances. Various implementations discussed herein use CMOS transistors to provide active inductance that consumes less area than passive inductors with similar characteristics. The transfer function of the CML buffer circuit can be set using a control signal and thereby adjust the frequency response characteristics (e.g., the gain). For example, different values of the control signal can correspond to different modes of operation for the CML buffer circuit. In a first mode, the CML buffer circuit can provide high gain at low frequencies. In a second mode, the CML buffer circuit can provide high gain for high frequencies, and low gain for low frequencies. The first and second modes can allow for an effective bandwidth that is large, while also allowing for low frequency (noise) components to be attenuated when the desired operational frequency is high.

As used herein, the operational frequency represents the frequency of the signals buffered by the CML buffer circuit. For example, the CML buffer circuit can be used to drive one or more clock paths and the operational frequency can be the frequency of the clock provided on the paths. In other instances, the CML buffer circuit can be used to drive data signals at a particular frequency. It is also possible that the CML buffer circuit can be used in connection with signals covering a range of frequencies and the CML buffer circuit mode can be selected based upon the input-output transfer function that better matches the range of frequencies.

As discussed herein, particular implementations are directed toward the use of a CML buffer circuit within a programmable logic device (PLD). For instance, the CML buffer circuit can be used for high speed clock paths within a PLD. Unless otherwise stated, the CML buffer circuits and methods discussed herein can be used with a variety of other devices, circuits, and applications.

Figure 1:
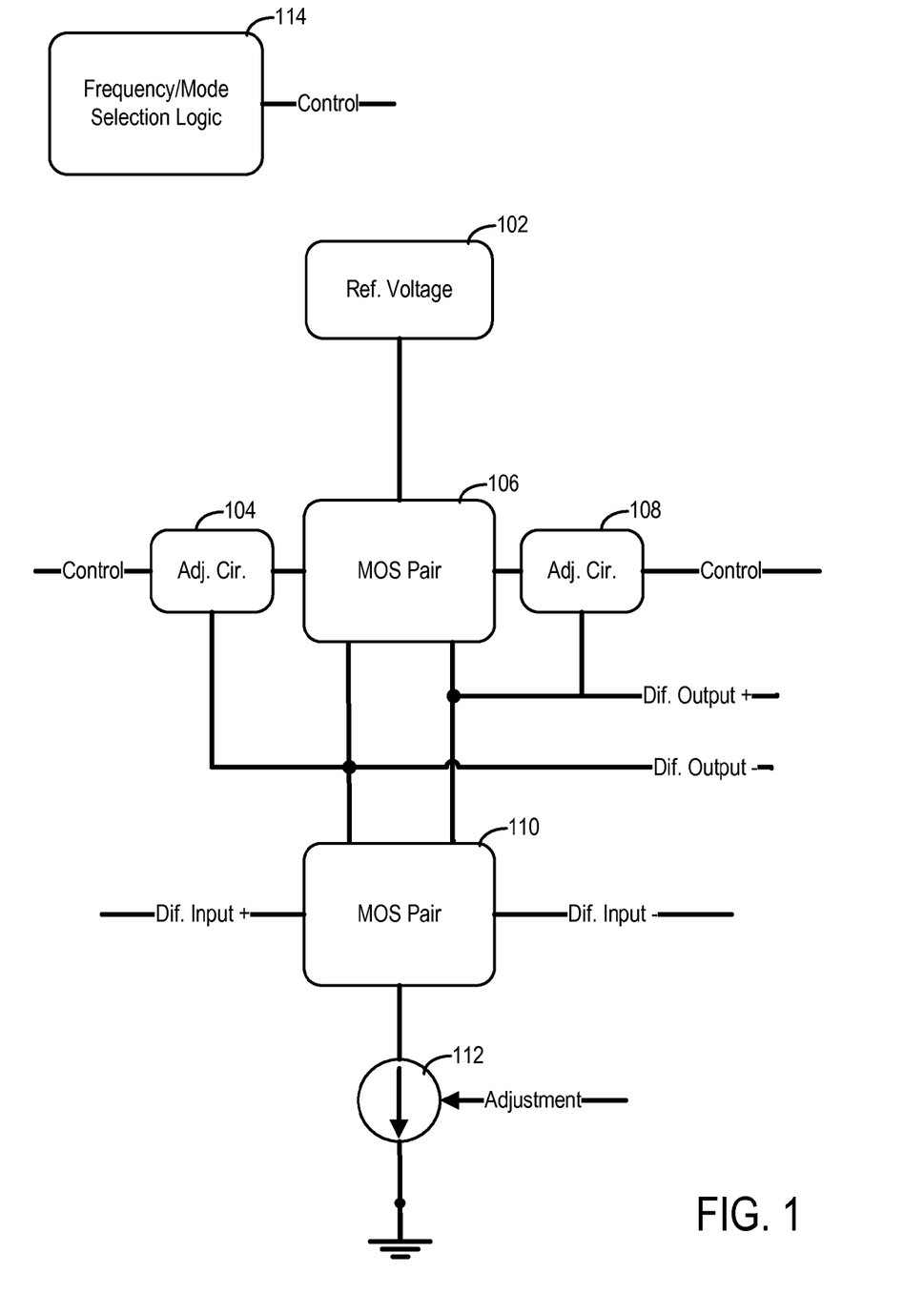
FIG. 1 depicts a block diagram for a CML buffer circuit, consistent with implementations of the present disclosure.

Turning now to the figures, FIG. 1 depicts a block diagram for a CML buffer circuit, consistent with implementations of the present disclosure. An input stage can include an input MOS (transistor) pair 110 that is configured to receive a differential input signal pair: 116 ("Dif. Input+") and 118 ("Dif. Input−.") For instance, the differential input pair can be a differential voltage signal that can be used for data communications between PLD blocks. Particular implementations allow for the differential input pair to be used in connection with high speed clock paths between PLD blocks. Current source 112 can be configured to provide source current to the input MOS pair 110. In certain implementations, current source 112 can be programmable for different current levels. The programmable current levels can be useful adjusting the current when tuning the CML buffer to lower frequency bins. The input MOS pair 110 can be configured to generate, based upon the value of the differential input signal pair, a differential output current. The differential output current is a relative current difference in each of (between) the outputs of the CML buffer circuit: 120 ("Dif. Output+") and 122 ("Diff. Output−.") The output current is based upon distributing or splitting current from the current source 112 between the two output paths as a function of the differential input signal pair.

An output stage can include an output MOS pair 106 that is configured to generate a differential output voltage at the outputs of the CML buffer circuit. The differential output voltage can be a function of an input-output transfer function of the CML buffer circuit. For instance, the differential output voltage can be set based upon a voltage drop across each MOS transistor in the output MOS pair 106. The voltage drop can be relative to reference voltage source 102. For example, the differential output current is applied to each transistor in the output MOS pair 106 to create different voltages corresponding to the effective impedance of each transistor at the relevant frequency or frequencies.

Consistent with various implementations, the output MOS pair 106 are each configured to operate as active inductors. MOS transistors can consume less physical area than passive inductors, and the resulting savings in space can be particularly relevant for small and/or complex integrated circuits that can have area constraints. The corresponding effective impedance therefore includes an inductive component that can provide a high voltage swing with low current value being provided by the current source 112. In some implementations, the effective impedance of the output MOS pair 106 can also include a high resistive value. Thus, requirements on size of the current source of the circuit can be relaxed and the circuit may also provide power savings over solutions that use larger current sources.

Adjustment circuits 104 and 108 can be configured to respond to a control signal by modifying the effective impedance of each transistor in the output MOS pair 106. The ability to adjust the effective impedance can be particularly useful for providing different operating characteristics and input-output transfer functions, depending upon the operational frequency of the particular application. This can provide an effective bandwidth that is relatively large when compared to a static effective impedance and corresponding input-output transfer function. The change in effective impedance causes a corresponding change in the input-output transfer function of the CML buffer circuit. For instance, a zero of the transfer function can be shifted between lower and higher frequencies. When the pole is located at lower frequencies, the CML buffer circuit will allow low frequency signal components to be passed to the outputs. This allows for the CML buffer circuit to operate with a low operational frequency by passing the low signal frequencies. When the pole is located at the higher frequencies, the CML buffer circuit will attenuate lower frequency signal components while allowing the high frequency signal components to be passed to the outputs. This allows for the CML buffer circuit to operate with a high operational frequency by attenuating the unwanted low signal frequencies, which can otherwise degrade the operation of the CML buffer circuit (e.g., by introducing direct current (DC) bias or noise). The ability to have attenuation at different frequencies can provide an effective increase in the operational bandwidth of the CML buffer circuit. In certain implementations, the effective impedance can be changed by enabling or disabling switches that control (within the CML buffer circuit) resistor elements, capacitor elements, or both.

In some implementations, mode, or frequency, selection logic 114 can be used to generate the control signal. The selection logic 114 can be configured to change according to the needs of the particular solution. For example, the solution might use more than one frequency of operation for a communication protocol with multiple modes, or for multiple communication protocols. The selection logic 114 can be configured to generate a different value for the control signal depending upon the current frequency of operation that is being used. In another example, the CML buffer circuit can used in the internal communication paths (e.g., clock paths) of a PLD that can be configured to operate at different frequencies depending upon the particular design. The selection logic 114 can be programmed to generate the appropriate control signal as part of the design (whether the control signal is statically assigned a value upon programming of the PLD or is able to be dynamically changed during operation).

Consistent with the description herein, certain implementations allow for more than two modes of operation for the CML buffer circuit. In particular, the control signal can have three or more values that correspond to respective and different input-output transfer functions for the CML buffer circuit.

Figure 2:
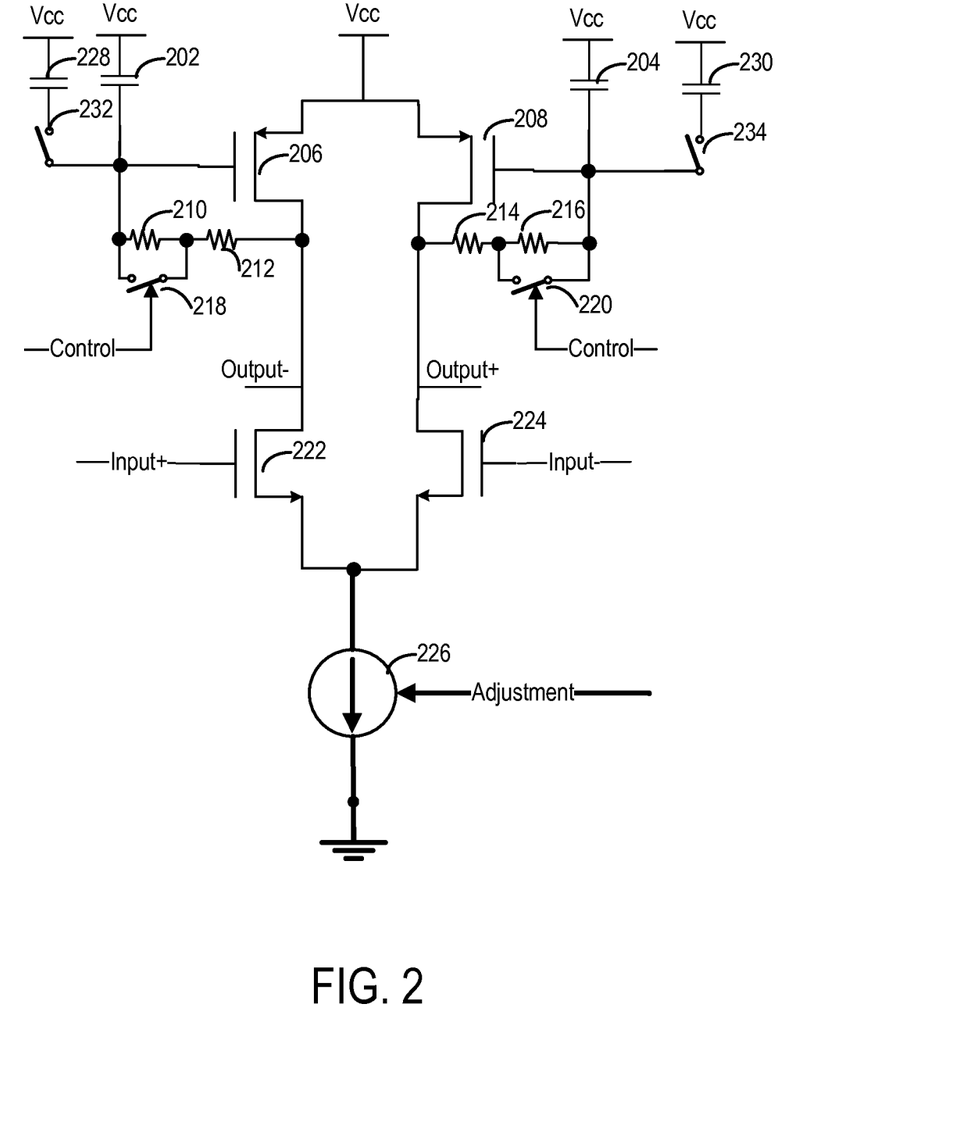
FIG. 2 depicts a circuit diagram for a CML buffer circuit, consistent with various implementations.

FIG. 2 depicts a circuit diagram for a CML buffer circuit, consistent with various implementations. The CML buffer circuit is consistent with the CML buffer circuit discussed in connection with FIG. 1. The CML buffer circuit generates a differential output pair (122 "Output–" and 120 "Output+") from a differential input pair (118 "Input–" and "116 Input+"). The input pair is provided to the gates of an input MOS transistor pair 222 and 224. Each of the input MOS transistors is connected in series between a respective output and a current source 226.

An output MOS transistor pair includes two output MOS transistors 206 and 208. The output MOS transistors 206 and 208 are connected in series between a reference voltage (Vcc) and a respective output of the differential output pair. The output MOS transistors can be configured to operate as active inductors. In particular, the MOS transistors small signal characteristics are similar to those of a passive inductor in that the voltage across the MOS transistors is a function of the change in current through the MOS transistors. This results in inductive peaking (shunting) that can be useful for improving the bandwidth of the CML buffer circuit, as discussed in mere detail herein. The particular input-output transfer function of the circuit can be adjusted for different operational frequencies. For instance, two adjustment circuits can be used, with each adjustment circuit being configured to adjust a resistance value between the gate and corresponding output of the respective output MOS transistor. In the example depicted in FIG. 2, the adjustment circuits include two resistors 210, 212 and 214, 216, respectively. The adjustment circuits also include a bypass switch 218 and 220, respectively. The bypass switch can be enabled and disabled in response to a control signal. When enabled (closed), the bypass switches 218, 220 can bypass resistors 210, 216 and reduce the effective resistance between the gate and the output to the value of resistors 212, 214. When disabled, the resistors 210, 216 form a series resistance of the values for resistors 210+212 and 214+216, respectively. FIG. 2 also depicts capacitors 202, 204, which represent the intrinsic gate-to-source capacitance of the output MOS transistors 206, 208.

In some instances, the adjustment circuit can also include capacitors 228 and 230, respectively. When enabled, switches 232 and 234 can add the capacitors to the circuit to increase the effective capacitance. When disabled, the capacitors are disconnected from the circuit and do not contribute.

The input MOS pair are depicted as N-MOS transistors and the output MOS pair are depicted as P-MOS transistors. For simplicity, the discussion and figure are discussed in this manner, however, various implementations allow for the use of P-MOS transistors for the input MOS pair and N-MOS transistors for the output MOS pair.

As discussed herein, the small signal equivalent circuit for the output MOS transistors and adjustment circuits is a function of the resistance between the gate and the source (or the outputs). Thus, the input-output transfer function of the CML buffer circuit varies according to whether or not the bypass switches 218, 220 are enabled or disabled. In particular, when the gate-source resistance decreases, the pole of the transfer function shifts to a higher frequency. As such, enabling the switches can shift the pole to a higher frequency and place the CML buffer circuit in a mode that is designed for use with a higher operational frequency. When this resistance increases, the pole of the transfer function shifts to a higher frequency. As such, disabling the switches can shift the pole to a lower frequency and place the CML buffer circuit in a mode that is designed for use with a lower operational frequency.

According to certain implementations the CML buffer circuit can be configured with shunt peaking that can provide up to about 1.7 time bandwidth increase over conventional CML buffer circuits, with the bandwidth equal to 1/(2pi*RL*CL) for a typical CML.

The resistors 210, 212, 214, and 216 can have the same value or can be set with different ratios. The particular ratio can be set according to the desired bandwidth and the desired operational frequencies for the corresponding modes.

Figure 3:
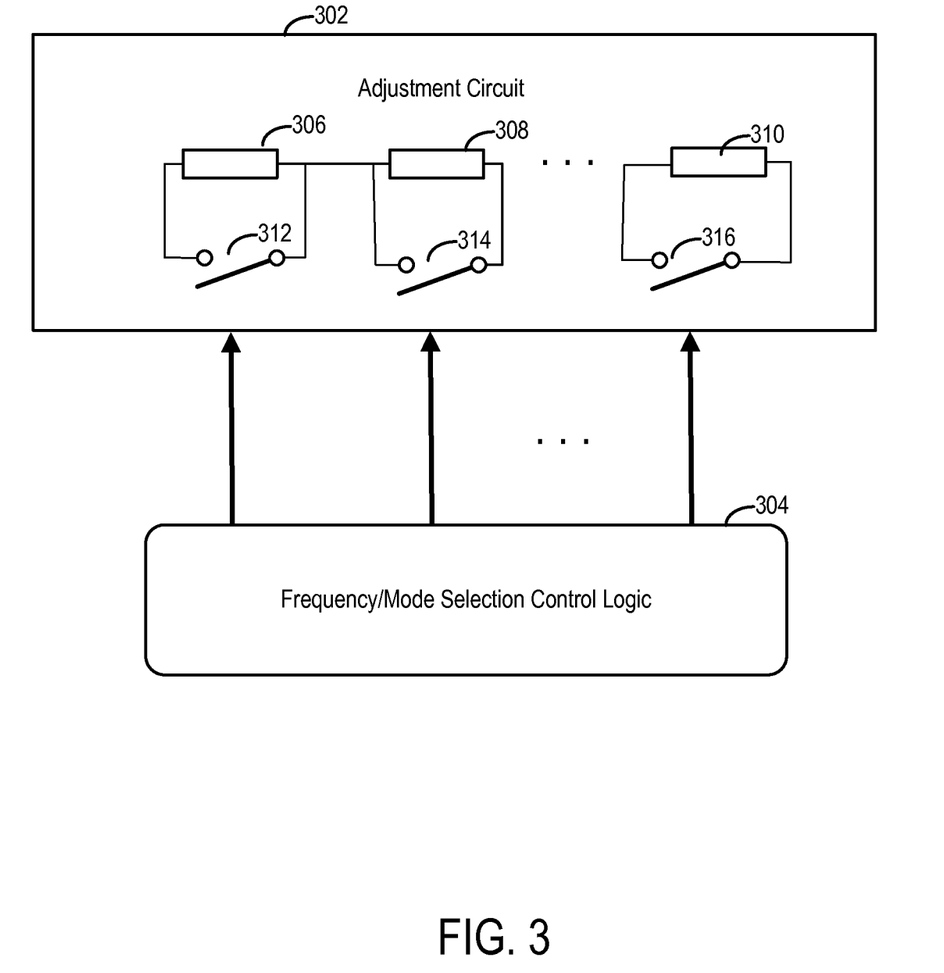
FIG. 3 depicts an adjustment circuit and control logic with multiple selection options, consistent with implementations of the present disclosure.

FIG. 3 depicts an adjustment circuit and control logic with multiple selection options, consistent with implementations of the present disclosure. Adjustment circuit 302 (e.g., corresponding to adjustment circuit 104) can be configured to provide three or more different resistive values in order to provide three or more modes. Each of the modes can have a different input-output transfer function. Switches 312, 314, and 316 can selectively bypass impedance elements 306, 308, and 310, respectively. Different switch settings can thereby result in different impedance values and corresponding input-output transform functions for the CML buffer circuit.

Frequency/mode selection control logic 304 (e.g. corresponding to frequency/mode selection logic 114), can be configured to control the switches 312, 314, and 316 in order to configure the input-output transfer function of the CML buffer circuit. The control signals can each correspond to a respective binary selection value. Control logic 304 can be configured to determine the binary selection value based upon the desired operational frequency. Consistent with some implementations, the values of impedance (e.g., resistive and/or capacitive) elements 306, 308, and 310 can be different. Consistent with the discussion of FIG. 2, the adjustment circuits can include resistive elements, capacitive elements, or both. Each impedance element can be effectively added or removed from the circuit in order to adjust the input-output transfer function of the CML buffer circuit.

Control logic 304 can be configured to selectively enable different combinations of impedance values in order to select different operational frequencies. Relative to using the same value of impedance elements, the smaller impedance values can be used to provide smaller granularity in the selectable impedance values, while the larger impedance values can be used to provide a larger overall range of impedance values.

Figure 4:
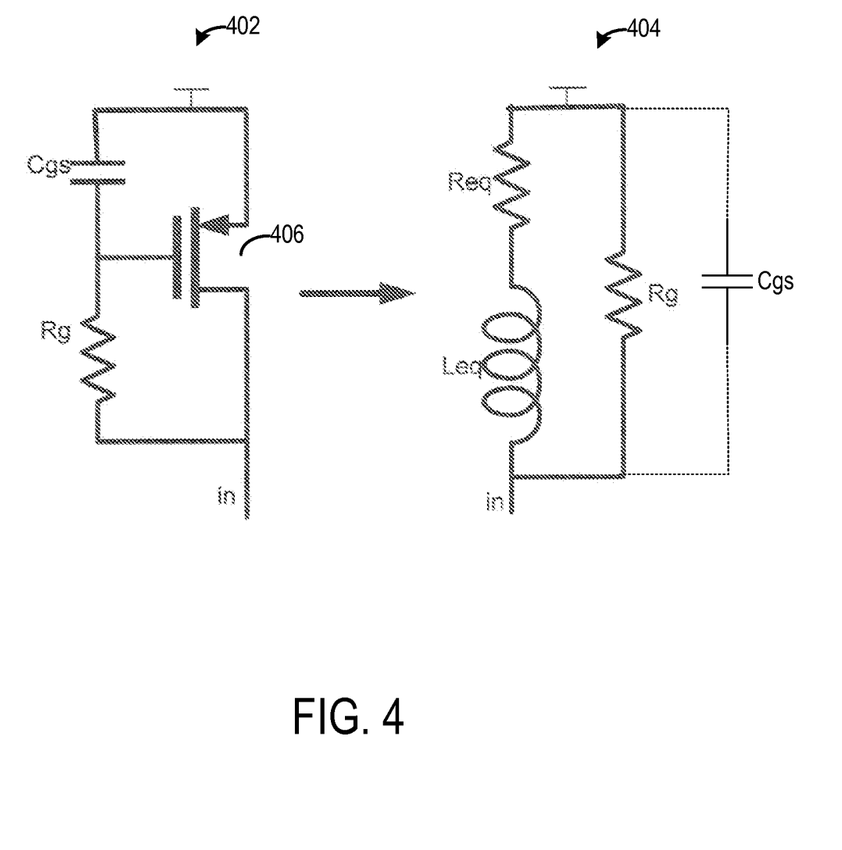
FIG. 4 depicts the small signal equivalent circuit for one transistor of an output transistor pair, consistent with implementations of the present disclosure.

FIG. 4 depicts the small signal equivalent circuit for one transistor and adjustment circuit of an output transistor pair, consistent with implementations of the present disclosure. Circuit 402 corresponds to a MOS transistor and adjustment circuit of an output MOS transistor pair, consistent with the discussion herein (e.g., 104 and 106). As previously described, the gate of the MOS transistor 406 is connected to the output through a resistor $R_g$. The gate-to-source capacitance of the circuit is represented by the capacitor $C_{gs}$.

Circuit 404 shows the small signal equivalence of circuit 402. The small signal equivalence can be useful for describing to the (small signal) properties of the circuit during its operation by approximating the functional equivalent circuit components for the circuit operating near a bias point. The values $R_{eq}$ and $L_{eq}$ are the equivalent series impedance of the MOS transistor. In addition to being connected in parallel with $R_{eq}$ and $L_{eq}$, resistive value $R_g$ affects the Leq value, as discussed herein. Thus, the resistive value $R_g$ has a direct correlation to the gain of the circuit. The capacitance value $C_g$ can represent the parasitic capacitance of the transistor and circuit. These small signal values can be used to describe and understand the operation of one or more of the output circuits discussed herein.

Figure 5:
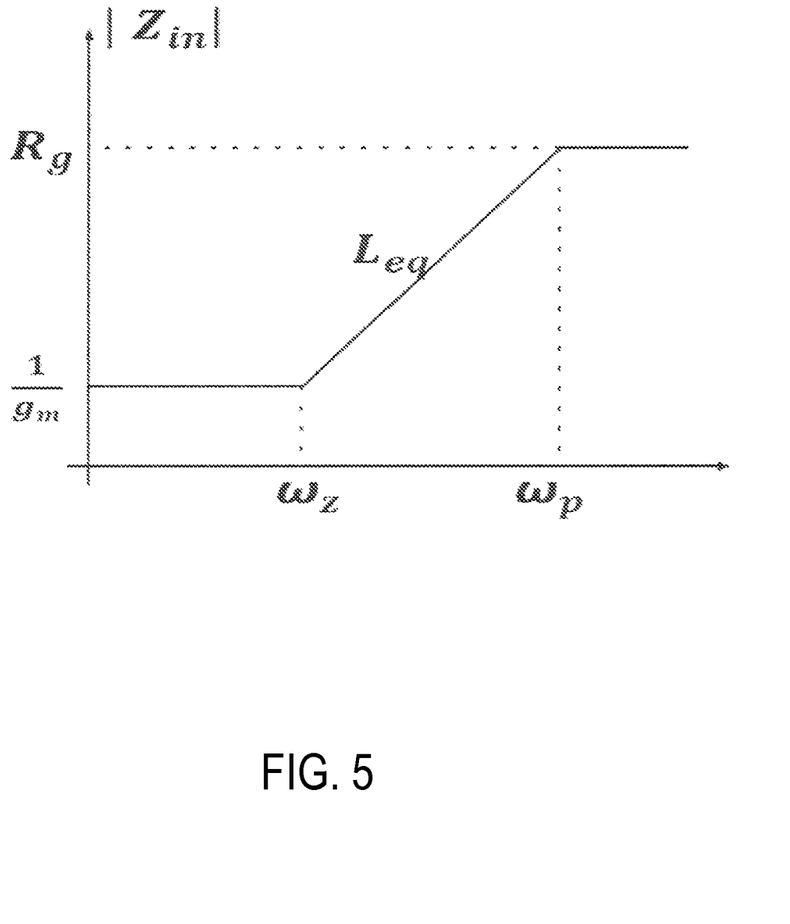
FIG. 5 depicts an input-output transfer function of a CML buffer circuit, consistent with implementations of the present disclosure.

FIG. 5 depicts an input-output transfer function of a CML buffer circuit, consistent with implementations of the present disclosure. The horizontal axis represents frequency and the vertical axis represents impedance. The line represents the input impedance of the CML buffer circuit "$Z_{in}$." At low frequency, $Z_{in}$ is equivalent to $1/g_m$ (where $g_m$ is the transconductance gain of the MOS transistor) and at high frequency $Z_{in}$ is equivalent to the gate-to-drain resistance ($R_g$). For frequencies in between, the input impedance tracks with $L_{eq}$, which is equivalent to $(R_g*C_{gs})/g_m$. The zero ($w_z$) is equivalent to $1/(R_g*C_{gs})$ and the pole ($w_p$) is $g_m/C_{gs}$. Accordingly, the zero is dependent upon $R_g$ and can be controlled using an adjustment circuit that is configured to change the $R_g$ value. As the resistive value is lowered, the zero is moved to higher frequencies. When the resistive value is high, the zero is moved to lower frequencies. Accordingly, the input-output transfer function can be adjusted for a particular operational frequency in a manner that also attenuates undesired low frequency signals when the operational frequency is set to the higher value(s).

In some implementations, the circuit can include a programmable current source. Adjustments to the current can be used to modulate $g_m$ which also changes $L_{eq}$, which can be useful for frequency scalability. For higher current, the lower Leq peak shifts to higher frequencies. For lower current, the higher $L_{eq}$ peak shifts to lower frequencies.

Figure 6:
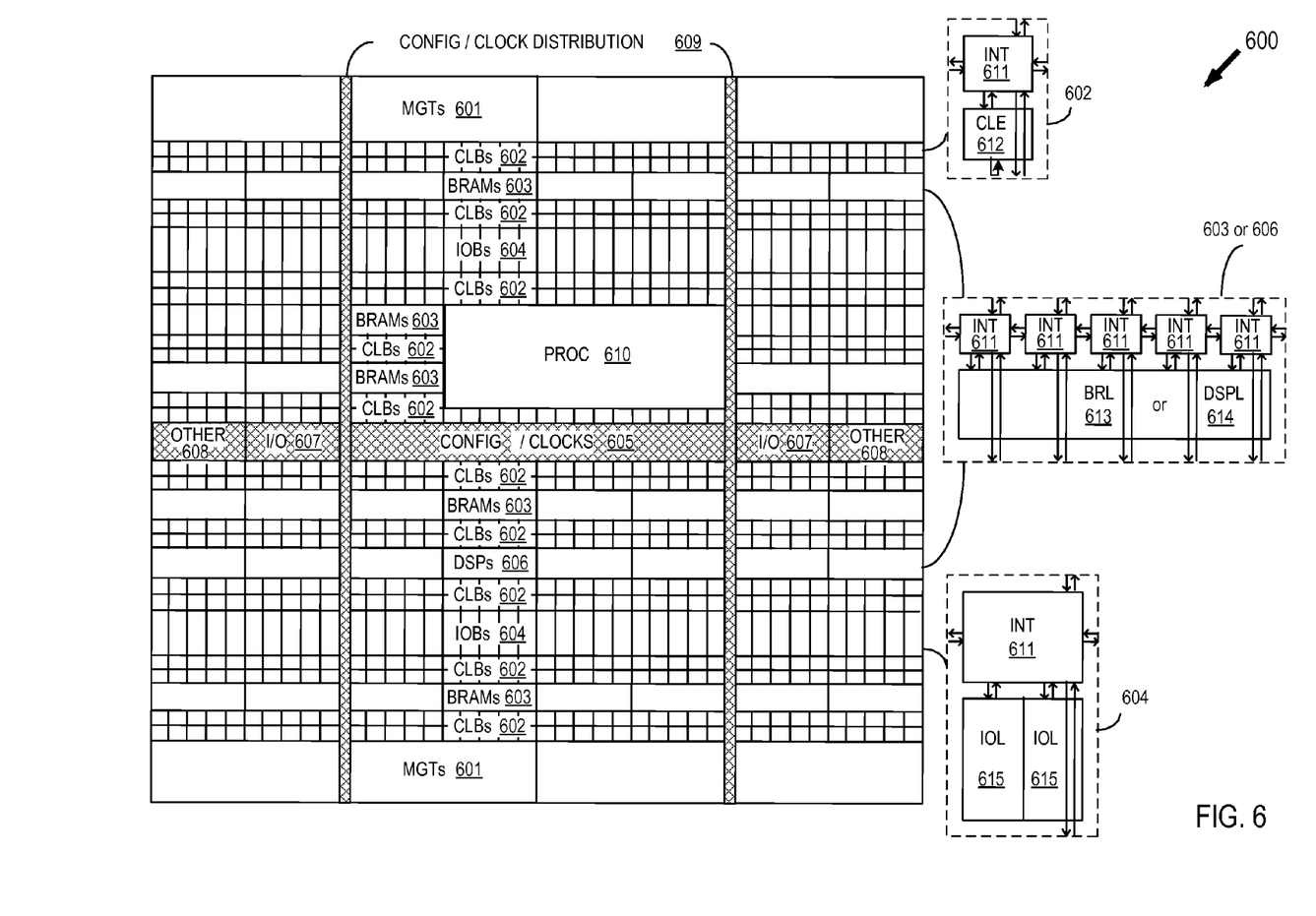
FIG. 6 shows a programmable integrated circuit (IC) on which the disclosed circuits and processes may be implemented.

FIG. 6 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6. In some implementations the interconnect elements can be driven by CML buffer circuits consistent with the circuits discussed here.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured implementation, a BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In the pictured implementation, a columnar area near the center of the die (shown shaded in FIG. 6) is used for configuration, clock, and other control logic. Horizontal areas 609 extending from this column are used to distribute the clock and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an example programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are merely an example. For example, in an actual programmable IC, more than one adjacent column of CLBs is typically included wherever the CLBs appear, to facilitate the efficient implementation of user logic.

Figure 7:
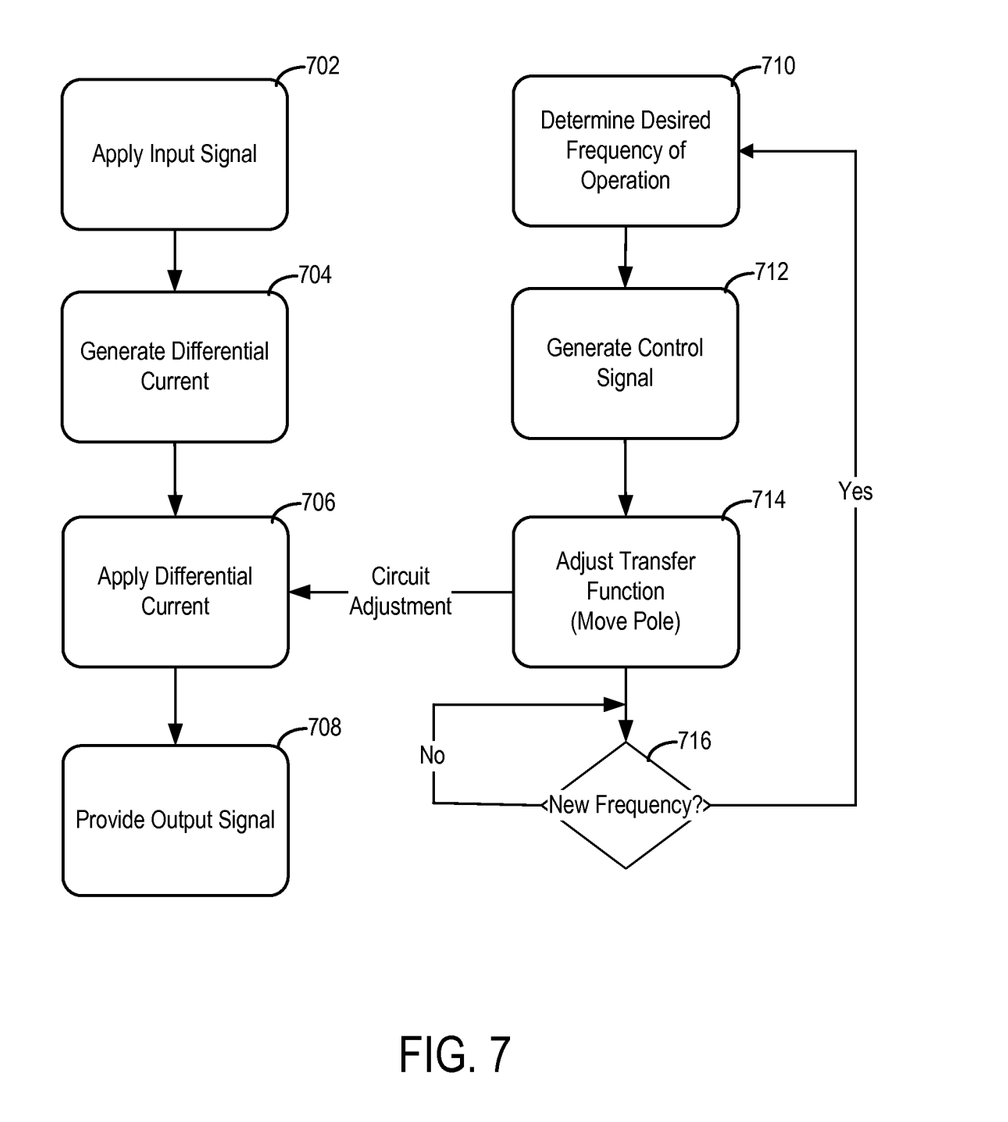
FIG. 7 depicts a flow diagram for using a CML buffer circuit, according to implementations of the present disclosure.

FIG. 7 depicts a flow diagram for using a CML buffer circuit, according to implementations of the present disclosure. A differential input signal can be applied or provided to a pair of inputs of a CML buffer circuit, per block 702. For instance, the CML buffer circuit can be located in the clock distribution block of a PLD and the input is a clock signal. The CML buffer circuit can then generate a differential current from the differential input, per block 704. As discussed herein, the differential current can be generated by sourcing different amounts for current (e.g., from a current source) through output paths and using an input MOS transistor pair.

The differential current can then be applied to an output MOS transistor pair, per block 706. Consistent with the various implementations discussed herein, the MOS transistor pair can be configured to provide an effective impedance that results in a voltage drop for the differential current and thereby generates a differential voltage for an output signal, per block 708.

According to implementations discussed herein, the value of the effective impedance value can be modified along with the input-output transfer function, which can be done before using the CML buffer circuit (e.g., an initialization setting), dynamically (e.g., in response to a change in communication mode or protocol), and combinations thereof. As shown in block 710, the desired frequency of operation can be determined and may include, for example, the use of state logic to determine the current mode of operation for the system in which the CML buffer circuit is being used.

Based upon the desired frequency of operation, control logic circuitry can generate one or more control signals, per block 712. These control signals can correspond to the switches that bypass resistors between the gate and drain of the output MOS transistor pair, as discussed in more detail herein, and result in the adjustment of the transfer function of the CML buffer circuit (e.g., by adjusting a pole), as shown by block 714. If the system is configured to dynamically adjust the transfer function of the CML buffer circuit, a decision can be made as to whether or not the frequency of operation has changed, per block 716. If so, the new desired frequency can be determined and the transfer function changed accordingly.

Those skilled in the art will appreciate that various alternative computing arrangements, including one or more processors and a memory arrangement configured with program code, would be suitable for hosting the processes and data structures that may carry out functions disclosed herein (e.g., frequency determination and control functions). In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use buffer circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A common mode logic (CML) buffer device comprising:
  a differential input signal pair that includes a first input and a second input;
  a differential output signal pair that includes a first output and a second output;
  a current source;
  a reference voltage;
  a first metal-oxide-semiconductor (MOS) transistor pair including:
    a first MOS transistor with a gate connected to the first input and connected in series between the current source and the first output, and
    a second MOS transistor with a gate connected to the second input and connected in series between the current source and the second output;
  a second MOS transistor pair including:
    a third MOS transistor connected in series between the reference voltage and the first output, and
    a fourth MOS transistor connected in series between the reference voltage and the second output;
  a first adjustment circuit configured to adjust, in response to a control signal, a first resistance value between the first output and a gate of the third MOS transistor; and
  a second adjustment circuit configured to adjust, in response to the control signal, a second resistance value between the second output and a gate of the fourth MOS transistor.

2. The device of claim 1, wherein the first adjustment circuit and second adjustment circuit each include a respective set of resistors and at least one respective bypass switch connection in parallel with one of the set of resistors.

3. The device of claim 1, wherein the common mode logic buffer device has an input-output transfer function that varies according to the first resistance value and the second resistance value.

4. The device of claim 3, wherein the varying of the input-output transfer function corresponds to a change in a pole of the input-output transfer function.

5. The device of claim 1, wherein the transistors of the second MOS transistor pair are each configured to function as active inductors.

6. The device of claim 5, wherein the device is configured to operate as a CML buffer circuit with inductive peaking.

7. The device of claim 1, wherein the first adjustment circuit is further configured to adjust, in response to the control signal, a first capacitance value between the gate of the third MOS transistor and the reference voltage.

8. The device of claim 7, wherein the second adjustment circuit is further configured to adjust, in response to the control signal, a second capacitance value between the gate of the fourth MOS transistor and the reference voltage.

9. A method for using a common mode logic (CML) buffer circuit, the method comprising:
  applying a differential input voltage between gates of a first metal-oxide-semiconductor (MOS) transistor pair;
  generating, using the first MOS transistor pair, a differential current between two output paths;
  applying the differential current to a second MOS transistor pair that is connected to adjustment circuits and that is configured to provide an output signal from the differential input voltage using a first transfer function with a pole at a first frequency; and
  changing, in response to a control signal received by the adjustment circuits, the pole to a second frequency that is different from the first frequency.

10. The method of claim 9, further comprising determining a frequency of operation for a signal applied as an input to the CML buffer circuit.

11. The method of claim 10, wherein the changing the pole is responsive to the determining a frequency of operation.

12. The method of claim 9, wherein the changing, in response to the control signal received by the adjustment circuits, the pole to the second frequency, includes adjusting a resistance value of the CML buffer circuit.

13. The method of claim 9, wherein the changing, in response to the control signal received by the adjustment circuits, the pole to a second frequency, includes adjusting a capacitance value of the CML buffer circuit.

14. The method of claim 9, wherein the generating, using the MOS transistor pair, the differential current between two output paths includes apportioning current from a current source between transistors of the MOS transistor pair.

15. The method of claim 14, further comprising adjusting an amount of current provided by the current source.

16. A common mode logic buffer device comprising:
  a current source configured to provide a source current;
  an input stage including a first metal-oxide-semiconductor (MOS) transistor pair configured to generate, from the source current and based upon an input differential voltage, a differential current between two output paths;
  an output stage including a second MOS transistor pair configured to generate an output differential voltage based upon an effective impedance provided for the each of the two output paths; and
  an adjustment circuit configured to adjust, in response to a control signal, the effective impedance of the second MOS transistor pair.

17. The device of claim 16, wherein the effective impedance of the second MOS transistor pair includes an inductive impedance that has a value that is adjustable in response to the control signal.

18. The device of claim 16, wherein the device is configured to operate as a CML buffer circuit with inductive peaking.

19. The device of claim 16, wherein the second MOS transistor pair includes two MOS transistors that are each configured to function as active inductors.

* * * * *